United States Patent [19]

Brodsky et al.

[11] 4,363,828
[45] Dec. 14, 1982

[54] METHOD FOR DEPOSITING SILICON FILMS AND RELATED MATERIALS BY A GLOW DISCHARGE IN A DISILAND OR HIGHER ORDER SILANE GAS

[75] Inventors: Marc H. Brodsky, Mt. Kisco; Bruce A. Scott, Pleasantville, both of N.Y.

[73] Assignee: International Business Machines Corp., Armonk, N.Y.

[21] Appl. No.: 102,814

[22] Filed: Dec. 12, 1979

[51] Int. Cl.³ .............................................. C23C 11/00
[52] U.S. Cl. ........................................ 427/39; 427/86
[58] Field of Search ................... 427/38, 39, 82, 84, 427/86; 357/2

[56] References Cited

U.S. PATENT DOCUMENTS

| | | | |
|---|---|---|---|
| 3,424,661 | 1/1969 | Androshuk et al. | 427/39 |
| 3,655,438 | 4/1972 | Sterling et al. | 427/39 |
| 4,064,521 | 12/1977 | Carlson | 427/39 |
| 4,142,195 | 2/1979 | Carlson et al. | 357/2 |

*Primary Examiner*—John H. Newsome
*Attorney, Agent, or Firm*—Pollock, Vande Sande & Priddy

[57] ABSTRACT

Disilane ($Si_2H_6$), trisilane ($Si_3H_8$) or a higher order silane is applied in a glow discharge process to rapidly and efficiently form a film of hydrogenated amorphous silicon on a substrate. An inductively coupled RF glow discharge apparatus, a capacitively coupled glow discharge apparatus or a DC glow discharge apparatus may be employed to deposit the amorphous silicon on a conducting or non-conducting substrate. The disilane or higher order silanes may also be combined in a glow discharge process with gases which contain elements such as nitrogen or oxygen to rapidly deposit corresponding compound films.

9 Claims, 1 Drawing Figure

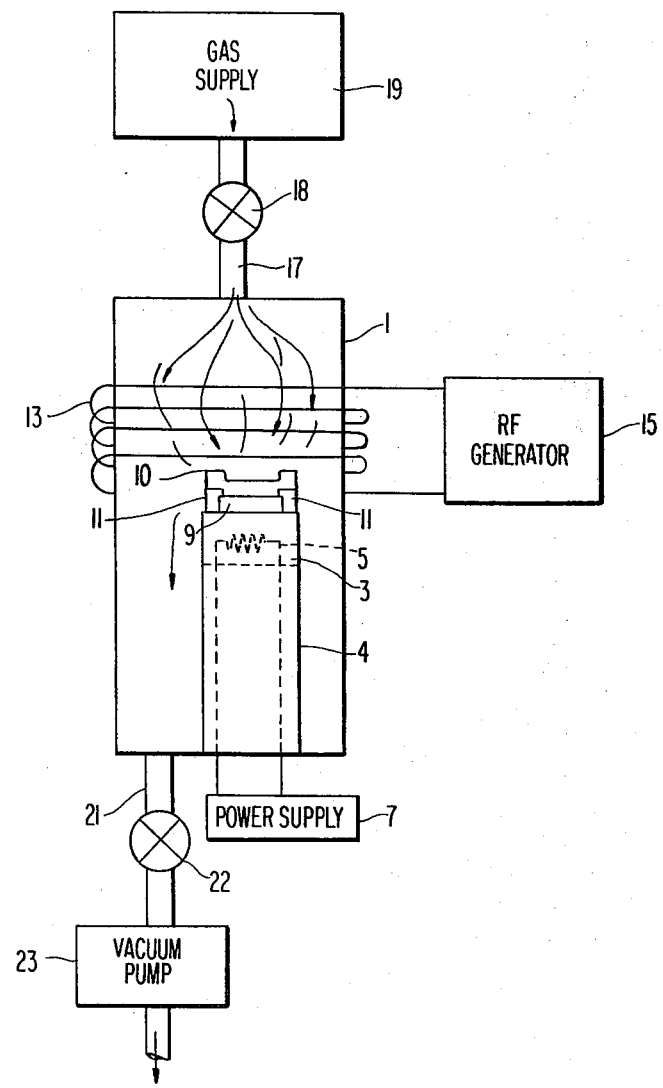

METHOD FOR DEPOSITING SILICON FILMS AND RELATED MATERIALS BY A GLOW DISCHARGE IN A DISILAND OR HIGHER ORDER SILANE GAS

TECHNICAL FIELD

The invention relates to an improved method for producing a film of hydrogenated amorphous silicon or a related material for a semiconducting or insulating device and, more particularly, to such a method wherein the amorphous silicon or related material is deposited by a glow discharge in a disilane or higher order silane gas.

BACKGROUND ART

It is known in the art relating to the manufacture of electrical semiconductor devices that a semiconductor film may be deposited on the surface of a substrate to produce useful semiconducting devices such as diodes, solar cells and transistors. For example, in the article, W. E. Spear et al, "Amorphous Silicon PN Junction", *Applied Physics Letters*, Vol. 28, pp. 105–107 (1976), it is shown that doped amorphous silicon layers that are produced from glow discharge plasmas of monosilane ($SiH_4$) may be deposited so as to form PN junctions with useful electrical rectification characteristics. Of course, other potential applications for deposited silicon films are known to those skilled in the art.

In the U.S. Pat. to Carlson, No. 4,064,521, it is indicated that an amorphous silicon semiconducting film may be formed on a substrate by a capacitive glow discharge in a monosilane ($SiH_4$) gas. It is further indicated that the amorphous silicon film that is produced possesses characteristics that are ideally suited for a photovoltaic device and that are superior to the characteristics of a crystalline silicon film. For example, the optical absorption of the amorphous silicon is superior to the absorption of single crystalline silicon over the visible light range. Also, the electron lifetime in amorphous silicon that is produced by the glow discharge method is substantially longer than the electron lifetime of amorphous silicon that is formed by either sputtering or evaporation.

In the article by M. H. Brodsky, "Plasma Preparations of Amorphous Silicon Films", *Thin Solid Films*, Vol. 50, pp. 57–67 (1978), it is indicated that if a relatively high gas pressure is used in the glow discharge of monosilane, the deposited silicon film will polymerize, thereby degrading the amorphous silicon that is produced. Accordingly, in the process of Carlson, the pressure must be maintained at a relatively low level during the glow discharge process in order to ensure that amorphous silicon having the desired photoelectric properties will be produced.

However, the deposition parameters of a chemical vapor deposition process, such as the glow discharge process of Carlson, determine the rate at which a material is deposited on a substrate. More particularly, it has been determined that, in general, the rate of deposition will be increased if the pressure is increased during the deposition process. Thus, if it is necessary to reduce the pressure to produce a particular deposition product, as is suggested in Carlson, the reduced pressure will result in a corresponding reduced rate of deposition and an associated decrease in the efficiency of the deposition process.

The slow rate of deposition also, apparently, causes a strain to appear at the interface between the deposited film and the supporting substrate. The strain tends to warp or distort the substrate and also limits the thickness of the film that may be deposited on the substrate. Moreover, a reduced rate of deposition often results in the deposition of a film that has a rather rough surface, since the slow rate of deposition makes the deposition process more sensitive to physical factors that operate to vary the rate of growth at different locations on the substrate. The roughness of the film increases the probability that the film will break down in response to applied operational voltages and, also, the rough surface may cause nonuniform electrical fields to be produced if the film is employed in a semiconductor device.

It is shown in the U.S. Pat. to Androshuk et al, No. 3,424,661, that thin films of the oxides, carbides, borides and nitrides of silicon may be deposited on a substrate by a DC reactive plasma technique wherein monosilane ($SiH_4$) is combined in a plasma with an associated reacting gas to deposit a silicon compound on a heated substrate. Disilane ($Si_2H_6$) and trisilane ($Si_3H_8$) are purported to be chemically equivalent to monosilane.

In the glow discharge process of Androshuk et al, it is necessary to establish particular levels of temperature, pressure and DC excitation power to ensure that a film having favorable protective or other insulating properties is deposited. Accordingly, as indicated at Col. 4, lines 10–11 of Androshuk et al, a gas pressure of from 0.1 torr to 10 torr must be applied in the glow discharge apparatus to form a plasma that is sufficiently dense to be useful in the deposition process.

It is indicated at Col. 4, lines 42–49 of Androshuk et al that amorphous silicon nitride films have desirable insulating or protective properties and may be produced if a particular, relatively low temperature range is maintained during the glow discharge process. It is further indicated that as the deposition temperature rises outside the accepted range, the film becomes increasingly crystalline, thereby losing the favorable properties associated with an amorphous structure. Thus, insulating or protective films may be deposited in accordance with the Androshuk process at a relatively high pressure of from 0.1 torr to 10 torr and, if an amorphous silicon nitride film is desired, a relatively low deposition temperature must be maintained.

In the paper by R. A. Street, J. C. Knights and D. K. Biegelsen, "Luminescence Studies of Plasma-Deposited Hydrogenated Silicon", *Physical Review*, Vol. 18, pp. 1885–1891 (1978), it is stated that favorable semiconducting properties of deposited silicon films are associated with the luminescence of the films, and the luminescence of the films decreases with increasing pressure and RF excitation power. Thus, in prior art deposition systems, the deposition pressure and power have been maintained at relatively low levels in order to provide superior semiconducting properties for a deposited film. However, as indicated above, lower deposition pressures tend to slow down the rate of deposition and thereby decrease the efficiency of the deposition process.

Accordingly, it is a primary object of the invention to provide an improved process for rapidly and efficiently depositing a film having superior photoelectronic, semiconducting or other electrical properties.

Another object of the invention is to provide such a deposition process wherein the film is deposited on a substrate by a glow discharge in a silane of higher order than monosilane, the higher order silanes defined, in part, by the expression $Si_nH_y$, where n is equal to or greater than two.

A further object of the invention is to provide a glow discharge deposition process wherein the rate of the deposition is sufficient to ensure that there is a reduced strain or no strain at the interface between a deposited film and an associated supporting substrate.

Another object of the invention is to provide a deposition process wherein the deposited film has a relatively smooth surface.

A further object of the invention is to provide a deposition process wherein an amorphous silicon layer is rapidly formed on a substrate in response to a relatively low temperature and pressure and a relatively low excitation power in a glow discharge apparatus.

Another object of the invention is to provide a deposition process wherein a layer of hydrogenated amorphous silicon is deposited by a glow discharge in a silane gas of higher order than monosilane.

DISCLOSURE OF THE INVENTION

In order to achieve the objects of the invention and to overcome the problems of the prior art, the process of the invention includes a chemical vapor deposition apparatus for exciting a plasma comprised of a disilane or a higher order silane gas in a volume adjacent to the surface of a heated substrate to deposit a layer of hydrogenated amorphous silicon on the substrate.

The plasma may be excited by capacitively coupled radio frequency (RF) excitation, by inductively coupled RF excitation or by DC excitation. The substrate is supported by a heat-conducting pedestal that may be heated by an embedded resistive heating element. A flow of gas to the deposition apparatus is provided by means of a gas inlet pipe and an associated gas outlet pipe that is connected to a vacuum pump. Carrier gases or diluting gases such as, but not restricted to, argon may be used.

In an alternative embodiment of the invention, a film may be deposited on a substrate by means of a glow discharge in a gas including disilane or a higher order silane and a reacting gas containing an element from the group oxygen, nitrogen, carbon and boron. For example, the reacting gas may be carbon dioxide ($CO_2$), ammonia ($NH_3$), methane ($CH_4$) or diborane ($B_2H_6$).

BRIEF DESCRIPTION OF THE FIGURE

The FIGURE illustrates a diagrammatic view of an apparatus for depositing a film on a substrate by RF inductive coupling to a glow discharge in a disilane or a higher order silane gas.

BEST MODE FOR CARRYING OUT THE INVENTION

The remaining portion of this specification will describe preferred embodiments of the invention when read in conjunction with the attached drawing.

The drawing shows a diagrammatic illustration of an apparatus that may be employed to deposit an insulating film on a substrate, in accordance with the improved deposition process of the invention. As shown in the drawing, a reaction chamber 1 made of, for example quartz, contains a pedestal 3, preferably made of a heat conducting material such as aluminum, copper or carbon. A resistive heating element 5 is embedded in the pedestal 3 and is energized by a power supply 7 to heat the pedestal 3 to a desired deposition temperature. The pedestal 3 is supported by a support column 4, preferably made of a heat insulating material such as quartz or thin-wall stainless steel. The pedestal 3 and support 4 may be coated with a material such as nickel which is chemically resistant to the plasma gases of the apparatus.

A substrate 9 is supported on the pedestal 3 and is held in position by clamps 11. The substrate 9 may be made of any suitable substrate material that is known in the semiconductor art, for example quartz, sapphire ($Al_2O_3$), metals or transparent metal films and semiconductors. However, a metal or metallized substrate is preferred for use in the process of the invention.

A radio frequency (RF) coil 13 is disposed around the reaction chamber 1 and is connected to an RF generator 15 to inductively apply RF power to a region adjacent to the surface of the substrate 9. An input line 17 having a valve 18 connects a gas supply 19 to the interior of the reaction chamber 1 and an outlet line 21 and associated valve 22 connect a vacuum pump 23 with the interior of the reaction chamber 1.

In operation, the RF coil 13 forms a glow discharge adjacent to the surface of the substrate 9 and the gas supply 19 passes a deposition gas or gases at a pressure that is sufficient to form a plasma in the region of the glow discharge and to deposit a film 10 on the exposed surface of the substrate.

For a preferred embodiment of the invention, the gas supply 19 is operated to supply disilane gas ($Si_2H_6$) to the reaction chamber 1. The disilane gas may be produced by passing monosilane ($SiH_4$) gas through a separate glow discharge apparatus and then employing known separation techniques, for example distillation, to remove disilane from the reaction products. The disilane gas may then be supplied to the reaction chamber 1 by the inlet pipe 17 to produce a film of hydrogenated amorphous silicon. The disilane gas that does not react may be removed by the outlet pipe 21 and vented, collected for reuse or recirculated to the inlet pipe 17. It should be understood that other synthetic chemical techniques may be used to produce the disilane, without departing from the invention.

The deposition process for the preferred embodiment of the invention is initiated by operating the vacuum pump 23 to evacuate the reaction chamber 1 to a pressure of $10^{-3}$ torr or less. At the same time, the power supply 7 is turned on to energize the resistive heating element 5 and to thereby heat the substrate 9 to a particular reaction temperature. If it is desired to deposit a layer of hydrogenated amorphous silicon on the substrate 9, the substrate 9 may be heated to a temperature within the range of 200° to 350° C. Higher temperatures may be used to produce crystalline silicon films, if desired.

After a vacuum is established in the reaction chamber 1 and the substrate 9 is heated to a temperature within the indicated range, the disilane gas from the gas supply 19 is supplied to the reaction chamber 1 through the inlet pipe 17 and the vacuum pump 23 is continuously operated to provide a flow of gas at a pressure of less than 0.1 torr, depending upon the desired deposition rate and desired film properties.

The RF generator 15 and associated RF coil 13 operate to inductively couple RF power to a glow discharge region that is adjacent to the surface of the substrate 9. The induced RF excitation power produces a glow discharge in the region and, once the glow discharge is initiated, hydrogenated amorphous silicon is deposited on the substrate 9. It has been experimentally determined that for a 3 inch RF coil and a pedestal of approximately 1½ inches, an RF signal of 1 watt and 13.56 megahertz is sufficient to sustain a glow discharge in a disilane gas at the indicated pressure.

If a temperature of from 200° C. to 350° C. and a pressure of not more than 0.1 torr are applied during the deposition process, a film of monohydrogenated amorphous silicon will be rapidly formed on the surface of the substrate 9. Monohydrogenated amorphous silicon is differentiated from the more general hydrogenated amorphous silicon by the local chemical bonding environment of the hydrogen atoms. In monohydrogenated amorphous silicon the hydrogen is predominantly bonded to silicon atoms which have their other three bonds connected to other silicon atoms. More generally, hydrogenated amorphous silicon can have a significant fraction of its hydrogen atoms bonded to silicon atoms in local environments wherein at least two hydrogen atoms are bonded to the same silicon atom. It will be understood by those skilled in the art that monohydrogenated amorphous silicon is now thought to be the most desirable hydrogenated material for semiconductor films.

The monohydrogenated silicon that is produced in accordance with the method of the invention is characterized by approximately 85 atomic percent of silicon and 15 atomic percent of hydrogen for a 250° C. substrate temperature and a 0.07 torr pressure. For other temperatures and pressures within the indicated range, a different hydrogen content may result. In general, it should be understood that the invention is not limited to a particular hydrogen content for the deposited hydrogenated silicon.

In the process of the preferred embodiment of the invention, the temperature is maintained below the indicated high temperature level to avoid an excessive loss of hydrogen during the deposition process and to prevent the silicon film from crystallizing. The temperature is maintained above the indicated low temperature level to ensure that residual defects in the film are minimized and to avoid the formation of dihydride groups that, apparently, form at lower temperatures. Although a particular temperature range is indicated for forming hydrogenated amorphous silicon in accordance with a preferred embodiment of the invention, it should be understood that temperatures outside the indicated range may be employed to provide different properties for the film 10, without departing from the invention. Also, it should be understood that it is within the scope of the invention to add a diluting or carrier gas to the higher order silane to raise the total pressure, while keeping the pressure of the higher order silane within the indicated range.

Those skilled in the art will understand that it is known to produce a monohydrogenated amorphous silicon film by a glow discharge in a monosilane ($SiH_4$) gas. Such a glow discharge process is disclosed, for example, in the U.S. Pat. to Carlson, No. 4,064,521. However, if a glow discharge of monosilane gas is performed at the above-indicated temperature, pressure and RF power, a monohydrogenated silicon film will be formed relatively slowly, while if the same parameters are applied for a glow discharge in a disilane gas, the monohydrogenated silicon film will be produced much more rapidly.

Amorphous silicon films have been experimentally deposited by the disilane glow discharge process of the invention and the monosilane glow discharge process of the prior art on substrates of quartz, sapphire, crystal silicon and a metallized substance coated with molybdenum. It has been determined on the basis of the experimental depositions that the rate of growth of the film in the disilane process of the invention is approximately 25 times the rate of growth of the film in the prior art process. Also, the photoconductivity of the experimental amorphous silicon films of the disilane process was higher than the photo-conductivity of the films of the prior art monosilane process. However, it is not understood at the present time if the increased photo-conductivity is due to the use of disilane per se or is related to the process by which the disilane is prepared.

The disilane deposition process of the invention was applied within a temperature range of 250° C. to 300° C. to produce a Schottky barrier photovoltaic solar cell having the structure described in the U.S. Pat. to Carlson et al, No. 4,142,195. The solar cell that was produced by the process of the invention has a response that is at least as good as the response of a control solar cell that was produced within the indicated temperature range in accordance with a prior art monosilane deposition process. Of course, the deposition rate for the solar cell of the invention was much greater than the deposition rate for the solar cell that was produced in accordance with the prior art process.

It was also experimentally determined that, if a monohydrogenated amorphous film is produced in accordance with the invention, there is little or no strain produced at the interface between the film and the underlying substrate. However, if an amorphous silicon film is produced by a glow discharge of monosilane, a strain will typically be produced at the interface between the deposited film and the underlying substrate so that the substrate and/or the film will be warped or distorted.

It will be appreciated by those skilled in the art that a reduction or elimination of the strain at the interface between an insulating film and an associated supporting substrate will make it possible to grow relatively thicker films. Also, if strain is eliminated, the composition and thickness of a substrate may be selected within a wider range, since the substrate will not be subjected to undue stress.

The glow discharge of monosilane tends to produce semiconducting films that have somewhat rough surfaces, particularly if a substrate such as sapphire ($Al_2O_3$) is employed at the higher end of the indicated temperature range of 200° C. to 350° C. The rough surface of the film increases the probability that the film will break down when subjected to typical semiconductor voltages. Moreover, the rough film may also cause nonuniform electric fields to be generated during a semiconductor operation. However, the process of the invention tends to produce hydrogenated amorphous silicon films that are very smooth, particularly if the film is deposited on a quartz substrate. It is theorized that the disilane glow discharge process of the invention produces smooth film surfaces due to the rapid and, hence, uniform growth of the film.

Although the process of the invention has been described with respect to disilane gas, it should be understood that a trisilane gas ($Si_3H_8$) may be employed to rapidly and efficiently deposit a layer of hydrogenated amorphous silicon on a substrate. Trisilane was employed in the deposition process of the invention and was found to further increase the deposition rate of hydrogenated silicon by a factor of two over the disilane process or by a factor of 50 over the monosilane process. Also, it is believed that higher order silanes may be employed in the process of the invention. Higher order silanes may be generally defined by the chemical formula $Si_nH_y$, where n is greater than one and, for example for linear or branched higher order silanes, $y=2n+2$. For simple cyclic silanes, $y=2n$.

Although a preferred embodiment of the process of the invention has been described with respect to the production of hydrogenated amorphous silicon films by using the glow discharge of disilane or higher order silanes, it will be appreciated by those skilled in the art that the disilane or higher order silanes may be reacted with additional reaction gases to deposit semiconducting or insulating films of a different composition. For example, if ammonia gas is reacted with disilane or a higher order silane in a glow discharge process, a hydrogenated silicon nitride film will be deposited on an associated substrate. Alternatively, carbon dioxide may be reacted with disilane or a higher order silane to rapidly deposit a film of silicon dioxide on an underlying substrate, in accordance with the invention. As a further example, acetylene ($C_2H_2$) may be reacted with disilane or higher order silanes to rapidly deposit a film of a hydrogenated alloy of silicon and carbon. In addition, diborane ($B_2H_6$) may be reacted to produce a hydrogenated alloy or compound of silicon or boron.

In general, it should be understood that many other reacting gases, for example nitrogen, oxygen, methane or other hydrocarbons or higher order boranes may be reacted with disilane or a higher order silane, without departing from the spirit of the invention. Also, although particular examples of reacting gases have been cited, it should be appreciated that in any deposition or reaction process wherein the decomposition of monosilane is a rate limiting step in the process, disilane or a higher order silane may be employed to achieve the improved deposition results of the invention. Moreover, it should be appreciated that monosilane may be combined with a higher order silane or various higher order silanes may be combined to achieve a rapid deposition rate, in accordance with the invention.

It is expected that digermane ($Ge_2H_6$) or other higher order germanes of the form $Ge_nH_y$, where n is greater than one, will give improvements over monogermane ($GeH_4$) for the deposition of hydrogenated amorphous germanium and related materials. Accordingly, the substitution of digermane or higher order germanes for monogermane is within the scope of the invention.

It should be understood that the process of the invention may be employed to rapidly deposit semiconducting or insulating films on a substrate, while utilizing a lower pressure, temperature and/or excitation power. Accordingly, if for example a deposited film is sensitive to ultra-violet or other emissions from the plasma, the film may be rapidly produced in accordance with the invention with a relatively low level of radiation damage. Also, the process of the invention is carried out at the relatively low pressure of less than 0.1 torr and, therefore, the process is distinguished from prior art processes that require pressure equal to or greater than 0.1 torr to produce films at slower growth rates.

It will be understood by those skilled in the art that the lower pressures and powers of the process of the invention make it possible to consistently and rapidly produce hydrogenated amorphous silicon films having favorable photoelectronic and semiconductor properties. In the prior art processes, the relatively high levels of pressure and/or power that are required to increase the rate of deposition tend to cause the deposited film to have defects and to thereby lose some of its favorable semiconductor properties. Accordingly, it should be appreciated that in any deposition or reaction process wherein the decomposition of either monosilane or monogermane is a rate-limiting step in the process, disilane or a higher order silane or digermane or a higher order germane may be employed to achieve the improved deposition results of the invention.

If the process of the invention is used to deposit an amorphous insulating or semiconducting film containing silicon or germanium, it is expected that higher deposition rates will be provided for lower temperatures and pressures. If lower deposition temperatures and pressures are maintained, the crystallization that is known to occur with higher substrate temperatures may be avoided.

Although the process of the invention has been described with respect to a chemical vapor deposition apparatus that employs an inductively coupled glow discharge technique, it should be appreciated that other chemical vapor deposition methods are known to the art and may be employed without departing from the invention.

The phrase, "chemical vapor deposition method", is intended to encompass all known processes for depositing a solid substance from a gas input, including processes wherein a glow discharge plasma of the input gas or gases is employed to deposit a substance. Such a glow discharge plasma may be excited by any method known to the art, for example by RF inductive coupling, RF capacitive coupling or by DC voltages. Also, input gases may be thermally excited to provide a pyrolytic decomposition and/or reaction to achieve the results of the invention, without departing from the invention. Ultra-violet or laser excited chemical vapor processes also fall within the scope of the invention.

The invention may be embodied in others specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

INDUSTRIAL APPLICABILITY

The claimed deposition process may be employed to rapidly form insulating or semiconducting films for semiconducting devices such as diodes, solar cells and transistors. For example, hydrogenated amorphous silicon films may be rapidly grown on a substrate in a relatively low temperature and pressure environment. The rapid growth of the films increases the efficiency of the process for manufacturing semiconductors.

We claim:

1. A method of chemical vapor deposition wherein a silicon semiconducting film is uniformly deposited on a substrate at a high speed, resulting in a deposited film having a smooth surface and having a minimal strain at the film-substrate interface, comprising the steps of:
   supplying a silane deposition gas including a silane gas of a higher order than monosilane to a region adjacent a deposition surface of said substrate;

applying an excitation energy to said deposition gas for depositing a layer containing silicon on said deposition surface; and maintaining said deposition gas at a pressure of less than 0.1 torr during the deposition process.

2. The method of claim 1 including the step of controlling the temperature of said deposition gas to form a layer of hydrogenated amorphous silicon.

3. The method of claim 2 wherein said step of applying an excitation energy includes activating an RF coil to inductively couple RF energy to excite said deposition gas.

4. A method of chemical vapor deposition wherein a silicon containing semiconducting film is uniformly deposited on a substrate at a high speed, resulting in a deposited film having a smooth surface and having a minimal strain at the film-substrate interface, comprising the steps of:

supplying a silane deposition gas including a silane gas of a higher order than monosilane and at least one other reacting gas to a volume adjacent a deposition surface of said substrate;

applying an excitation energy for reacting the silane deposition gas and said at least one other reacting gas and for depositing a layer of a silicon containing substance on said deposition surface; and maintaining said deposition gas at a pressure of less than 0.1 torr during the deposition process.

5. The method of claim 4 wherein said at least one other reacting gas includes an element selected from the group consisting of oxygen, nitrogen, carbon and boron.

6. The method of claim 4 wherein said silane deposition gas includes disilane ($Si_2H_6$).

7. The method of claim 4 wherein said silane deposition gas includes trisilane ($Si_3H_8$).

8. A method of chemical vapor deposition wherein a germanium containing semiconducting film is uniformly deposited on a substrate at a high speed, resulting in a deposited film having a smooth surface and having a minimal strain at the film-substrate interface, comprising the steps of:

supplying a germane deposition gas including a germane gas of higher order than monogermane and at least one other reacting gas to a region adjacent a deposition surface of said substrate;

applying an excitation energy for reacting the germane deposition gas and said at least one other reacting gas and for depositing a layer of a germanium containing substance on said deposition surface; and maintaining said deposition gas at a pressure of less than 0.1 torr during the deposition process.

9. A method of chemical vapor deposition wherein a silicon containing film is uniformly deposited on a substrate at a high speed, resulting in a deposited film having a smooth surface and having a minimal strain at the film-substrate interface comprising the steps of;

supplying a carrier gas and a silane deposition gas including a silane gas of a higher order than monosilane to a region adjacent a deposition surface of said substrate;

applying an excitation energy to said deposition gas and carrier gas for depositing a layer containing silicon on said deposition surface; and maintaining said deposition gas at a pressure of less than 0.1 torr during the deposition process.

* * * * *

UNITED STATES PATENT AND TRADEMARK OFFICE
CERTIFICATE OF CORRECTION

PATENT NO. : 4,363,828
DATED      : Dec. 14, 1982
INVENTOR(S) : Marc H. Brodsky and Bruce A. Scott It is certified that error appears in the above—identified patent and that said Letters Patent is hereby corrected as shown below:

On the cover sheet, in the title, please correct the spelling of "DISILAND" to --- DISILANE ---.

Column 1, in the title, please correct the spelling of "DISILAND" to --- DISILANE ---.

Column 2, line 43, after the name "Androshuk", please insert the term --- , et al. ---.

Column 3, line 44, after the word "group", please insert the word --- of ---.

Column 6, line 10, please correct the spelling of "photo-conductivity" to --- photoconductivity ---.

Column 5, line 3, please change the number "1½" to --- 1¼ ---.

Column 6, lines 13-14, correct the spelling of "photo-conductivity" to --photoconductivity--.

Signed and Sealed this

Twenty-second Day of March 1983

[SEAL]

Attest:

GERALD J. MOSSINGHOFF

Attesting Officer   Commissioner of Patents and Trademarks